United States Patent [19]

Brabetz et al.

[11] Patent Number: 5,548,487

[45] Date of Patent: Aug. 20, 1996

[54] FLAT CIRCUIT MODULE MOUNTING USING AN ELASTIC PAD IN A DEPRESSION OF A CIRCUIT BOARD

[75] Inventors: Berhard Brabetz, Unterhaching; Hermann Wessely, München, both of Germany

[73] Assignee: Siemens Nixdorf Informationssysteme Aktiengesellchaft, Paderborn, Germany

[21] Appl. No.: 64,081

[22] PCT Filed: Sep. 7, 1992

[86] PCT No.: PCT/DE92/00754

§ 371 Date: May 17, 1993

§ 102(e) Date: May 17, 1993

[87] PCT Pub. No.: WO93/06703

PCT Pub. Date: Apr. 1, 1993

[30] Foreign Application Priority Data

Sep. 27, 1991 [DE] Germany ............... 9112099 U

[51] Int. Cl.⁶ ............... H05K 7/02; H05K 7/06; H05K 7/20; H01L 23/36
[52] U.S. Cl. ............ 361/769; 257/718; 257/719; 257/713; 361/707; 361/709; 361/713; 361/719; 361/717; 361/718
[58] Field of Search ............... 174/252, 138 G, 174/166 R, 166 S; 257/678, 706, 707, 713, 718, 719, 726, 727, 717; 361/707, 709, 710, 713, 715, 718, 719, 760, 761, 767, 768, 769, 770, 771, 772, 773, 776, 807, 808, 809, 705, 720, 717; 437/209, 215, 216

[56] References Cited

U.S. PATENT DOCUMENTS 3,225,262 12/1965 Myers ............... 174/138 G
4,833,570 5/1989 Teratani ............... 361/770
4,855,869 8/1989 Tsuji ............... 361/713
5,184,211 2/1993 Fox ............... 257/706
5,389,819 2/1995 Matsuoka ............... 257/727

FOREIGN PATENT DOCUMENTS

| 0191270 | 8/1986 | European Pat. Off. . | |
|---|---|---|---|
| 0226042 | 6/1987 | European Pat. Off. . | |
| 0338447 | 10/1989 | European Pat. Off. . | |
| 2586885 | 3/1987 | France | 361/713 |
| 60-257533 | 12/1985 | Japan | 257/727 |
| 63-117431 | 5/1988 | Japan | 257/678 |
| 5-109915 | 4/1993 | Japan | 257/727 |
| 5-283550 | 10/1993 | Japan | 257/727 |
| 2252451 | 8/1992 | United Kingdom . | |
| PCT/JP91/01006 | 7/1991 | WIPO . | |

OTHER PUBLICATIONS

IBM Technical Disclosure Bulletin "Heat Sink Assembly for TAB-Mounted Devices" vol. 31 No. 6 Nov. 1988.

*Primary Examiner*—Donald A. Sparks
*Attorney, Agent, or Firm*—Hill, Steadman & Simpson

[57] ABSTRACT

A flat circuit module assembly includes a circuit board and unpackaged, or housingless, chips mounted on its surface, with an elastic pressure pad between the circuit board and the chips. To achieve an adequate spring characteristic, the elastic pressure pad is dimensioned to be correspondingly thick, the consequence of which is that the Z bend of the terminal legs would be greater than would actually be needed for compensating for the thermal stress. To avoid this disadvantage, the invention provides depressions on the circuit board surface into which the pressure pads are placed. This reduces the tolerance range in the surface soldering area. The invention also provides that the circuit board is a multilayer board that has internal conductors, and further that the depression into with the pressure pad is placed extends to one of the internal conductive layers.

1 Claim, 1 Drawing Sheet

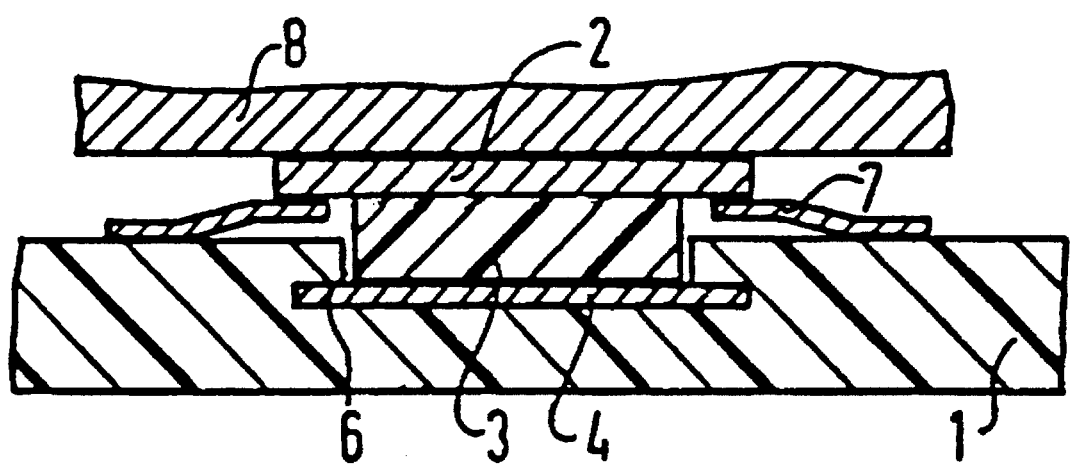

FLAT CIRCUIT MODULE MOUNTING USING AN ELASTIC PAD IN A DEPRESSION OF A CIRCUIT BOARD

BACKGROUND OF THE INVENTION

1. Field of the Invention

The present invention relates generally to a mounting for circuit chips and the like on printed circuit boards.

2. Description of the Related Art

In planar modules or assemblies, it is known to mount unpackaged housingless chips on a surface of a module circuit board (for example a microwiring circuit board) and to place between the circuit board and the chip an elastic pressure pad which has the task of pressing a surface of the chip against a cooling plate for the purpose of heat removal. To achieve an adequate spring characteristic, it is therefore necessary to dimension the elastic pressure pad between the chip and the microwiring board of a corresponding thickness. The consequence of this is, however, that a Z shaped bend of the terminal legs of the chip must be made greater than would actually be needed for compensating for thermal stresses. The greater this Z shaped bend is, however, the greater also are the tolerances in the surface soldering area of the terminal legs and the microwiring board.

SUMMARY OF THE INVENTION

It is an object of the present invention to provide an arrangement by means of which two contradictory demands, namely the thickest possible pressure pad and smallest the possible Z bend of the terminal legs can be achieved.

To achieve this object, the invention provides for depressions for accommodating the pressure pads to be provided on the surface of the circuit board.

The result of these measures is that the tolerances are reduced in the surface soldering area without impairing the heat transfer between the chip and the cooling plate.

Another aspect of the invention provides that the multi-layer boards have internal conductive layers and that the depression for accommodating the pressure pad extends to one of the conductive layers.

BRIEF DESCRIPTION OF THE DRAWINGS

The present invention is explained in greater detail with reference to the illustrative embodiment according to the FIGURE.

The FIGURE is a fragmentary cross section of a circuit chip mounted on a circuit board according to the principles of the present invention.

DETAILED DESCRIPTION OF THE PREFERRED EMBODIMENTS

On the microwiring circuit board 1, depressions 6 are provided into which the elastic pressure pad 3 can be placed, the lower support area or seating surface of the pressure pad being the next copper plane 4 following in the microwiring in the circuit board. As a result, the distance between a lower surface of the component 2 and the surface of the microwiring board is reduced so that the Z-shaped bend in the terminal legs 7 can be reduced. Nevertheless, the good contact of the surface of the chip 2 with the cooling plate 8 is retained.

Although other modifications and changes may be suggested by those skilled in the art, it is the intention of the inventors to embody within the patent warranted hereon all changes and modifications as reasonably and properly come within the scope of their contribution to the art.

We claim

1. An assembly for circuit chip mounting and cooling, comprising:

a multi-layer circuit board having a surface and internal conductive layers;

a circuit chip having a lower surface and surface mountable leads extending from at least two sides adjoining said lower surface and bent in a direction toward said lower surface, free ends of said leads connected to said surface of said multi-layer circuit board;

means defining a depression in said surface of said multi-layer circuit board opposite said lower surface of said circuit chip, said depression extending into said multi-layer circuit board to one of said internal conductive layers;

an elastic pressure pad loosely mounted in said depression and extending against said lower surface of said circuit chip; and means for removing heat from said circuit chip mounted against a surface of said circuit chip opposite said lower surface;

said elastic pressure pad pressing the lower surface of said circuit chip against said means for removing heat from said circuit chip.

* * * * *